United States Patent [19]

Pollock et al.

[11] Patent Number: 5,474,939
[45] Date of Patent: Dec. 12, 1995

[54] METHOD OF MAKING THIN FILM HETEROJUNCTION SOLAR CELL

[75] Inventors: Gary A. Pollock, Canoga Park; Kim W. Mitchell, Granada Hills, both of Calif.

[73] Assignee: Siemens Solar Industries International, Camarillo, Calif.

[21] Appl. No.: 330,933

[22] Filed: Oct. 28, 1994

Related U.S. Application Data

[63] Continuation-in-part of Ser. No. 230,040, Apr. 19, 1994, abandoned, which is a continuation of Ser. No. 998,211, Dec. 30, 1992, abandoned.

[51] Int. Cl.$^6$ .................................................... H01L 31/18
[52] U.S. Cl. .............................. 437/5; 136/264; 136/265
[58] Field of Search .................................. 437/5; 427/74, 427/76; 136/255, 260, 264, 265; 257/184, 200–201, 431, 461, 464

[56] References Cited

U.S. PATENT DOCUMENTS

| | | | |
|---|---|---|---|
| 4,335,266 | 6/1982 | Mickelsen et al. | 136/260 |
| 4,611,091 | 9/1986 | Choudary et al. | 136/260 |
| 4,612,411 | 9/1986 | Wieting et al. | 136/265 |
| 4,915,745 | 4/1990 | Pollock et al. | 136/265 |
| 5,045,409 | 9/1991 | Eberspacher et al. | 428/620 |

OTHER PUBLICATIONS

Seshan and Beiber, "Properties of Materials" (Handbook of Modern Electronics & Electrical Engineering) Publ. in Canada by John Wiley & Sons 1986 p. 109.

Nanto et al, "Electrical and Optical Properties of Zinc Oxide Films" J. Appl. Phys vol. 55 No. 4, Publ. FEBIS, 84, pp. 1029–1034, Partic 1032/3.

Major et al, "Electrical and Optical Transport In. Zinc Oxide Films" J. Mater. Res 1(2) Publ. 1986 E. G. p. 3 301/2.

Famrenbrucn & Bube "Atomic Surface Mobility, Nucleation and Growth" (Fundamentals of Solar Cells), Publ by Academic Press 1983, Partic pp. 347–352, FIG. 9.13/a).

R. D. Sharma et al, "Electroless Deposition of Cadmium Stannate Zinc Oxide, and Aluminium Doped Zinc Oxide Films", J. Appl. Phys 58(2) Jul. 1985, pp. 838–844.

R. L. Call et al, "Structural And Electronic Properties of Three Aqueous Deposited Films: CdS, CdO, ZnO For Semiconductor and Photovoltaic Applications", Solar Energy Materials 2(1980) 373–380.

K. L. Chopra et al, "Chemical Solution Deposition of Inorganic Films", Thin Film Laboratory, Indian Institute of Technology New Delhi, India, pp. 168–233 (No Publication Date).

*Primary Examiner*—Aaron Weisstuch

[57] ABSTRACT

A thin film photovoltaic device comprises a metal back contact having a first p-type semiconductor film of CVD CIS thereon; a second, transparent, n-type semiconductor film of CVD zinc oxide on the CIS and a thin interfacial film of transparent, insulating zinc oxide between the p-type CIS film and the n-type metal oxide. The interfacial zinc oxide film is formed by depositing zinc hydroxide on the CIS from a solution of one of zinc sulfate, zinc chloride, and zinc acetate and complexing agents comprising ammonium hydroxide and TEA and annealing the deposit to convert the zinc hydroxide to form the zinc oxide.

13 Claims, 1 Drawing Sheet

CALL 1 DATA

Eff = 13.3%
(13.16%)
Voc = 477 mV
Jsc = 39.5 mA/cm2
(39.2 BY SR)
FF = 0.704

Vmax = 374 mV
Jmax = 35.5 mA/cm2

Ssc = 0.00623
Soc = 0.0960

VOLTAGE mV

AREA: 3.46 cm2
MON : 0.0990 V

METHOD OF MAKING THIN FILM HETEROJUNCTION SOLAR CELL

This is a continuation-in-part application of Ser. No. 08/230,040 filed Apr. 19, 1994 which is a continuation of Ser. No. 07/998,211 filed Dec. 30, 1992.

FIELD OF THE INVENTION

The invention relates to thin film heterojunction solar cells formed from semiconductors, especially to those of the p-n type having a p-type layer comprising group I-III-VI semiconductors such as copper indium diselenide (CIS) and other chalcopyrite alloy materials and to a process for making high efficiency cells of such type.

BACKGROUND OF THE INVENTION

A known thin film, heterojunction solar cell of such type which was widely regarded as viable, is described in U.S. No. 4,335,226, issued to Mickelsen et al on Jun. 15, 1982 and teaches the provision of a layer of cadmium sulfide (CdS) on an absorber layer of CIS to provide a cell of high efficiency.

Among the many documented attempts to improve such high efficiency cells are U.S. No. 4,611,091 issued to Choudary et al on Sep. 9, 1986, and U.S. No. 5,049,409 issued to Eberspacher et al on Sep. 3, 1991, the disclosures of which are incorporated by reference herein.

The Eberspacher patent teaches an improved method of selenization of the CIS semiconductor, while Choudary teaches the replacement of a majority of the cadmium sulfide layer by providing a layer of a transparent, substantially conducting, wide band gap, n-type semiconductor, such as CVD zinc oxide, on only a very thin layer of chemically deposited cadmium sulfide.

In essence, both the last two patents represent responses to the well recognized desirability of minimizing or eliminating the use of highly toxic materials such as hydrogen selenide and cadmium (sulfide) in large scale solar cell manufacturing processes.

The chemically deposited cadmium sulfide approach taught by Choudary resulted in higher quality junctions than those from non-chemical, (non-cadmium) deposition processes in providing lower junction saturation current and increased shunt resistance, such improvement believed to result from an etching and selective "cleaning" action on the heterojunction interface arising from the chemical dipping.

An attempt to eliminate completely the highly toxic cadmium sulfide from the cell by replacement with zinc sulfide (ZnS) deposited from a solution of zinc acetate ($ZnAc_2$) dissolved in ammonium hydroxide/ammonium sulfide ($NH_9OH/(NH_4)2S$) was not successful. Although some zinc hydroxide ($Zn(OH)_2$), precipitate formed in the solution, no zinc could be detected on CIS dipped in that solution.

However, the discovery some years later, of CIS modules with cadmium sulfide layers chemically deposited from solution having actual thicknesses of less than 10 A° but which, nevertheless, performed effectively, in spite of a belief that a minimum thickness of 100A° was necessary (in the Eberspacher cell), led to the speculation that the cadmium sulfide was in fact acting substantially only as an insulating barrier between the CIS and CVD zinc oxide and that, possibly, relatively non-toxic, insulating zinc oxide could perform the same function.

Although U.S. No. 4,612,411 issued to Weiting et al teaches a layer of CVD ZnO which is said to be highly resistive, this is clearly only relative to a top layer of ZnO of low resistivity ($1\times10^{-3}$ ohm-cm) as the resistivity is only, preferably, 0.2 ohm-cm while the minimum thickness is 100 angstrom. It is believed that the resistivity of the resistive zinc oxide layer deposited by the process of this invention is significantly greater than that obtained by the Weiting teaching while its thickness is believed to be very much less, and no greater than approximately 10 angstroms, as it is unable to be measured by SEM techniques.

SUMMARY OF THE INVENTION

An object of the invention is to provide a high efficiency, thin film, heterojunction solar cell of the above described type but which does not contain cadmium sulfide.

A further object of the invention is to provide a process for making such solar cell which can be adapted for economical mass production at high volume while minimizing the concentrations or amounts of chemicals used while providing an acceptably high yield.

An additional object of the invention is to provide a solar cell which provides improved open circuit voltage ($V_{oc}$).

According to one aspect of the invention, a thin film photovoltaic device comprises a metal back contact; a first multinary semiconductor film of a first conductivity type on said back contact, preferably comprising a group I-III-VI compound semiconductor or other large band gap chalcopyrite alloy material; a second transparent semiconductor film of conductivity type opposite said first type on said first semiconductor film, and an interfacial film of a transparent, insulating metal oxide between said first semiconductor film and said second semiconductor film.

More specifically, the second semiconductor film comprises zinc oxide, the first semiconductor film comprises copper indium diselenide (CIS) or alloy thereof, and the insulating metal oxide comprises zinc oxide chemically deposited from solution thereon.

According to another aspect, the invention comprises a process for making a photovoltaic device, comprising the steps of depositing a first semiconductor film of a first conductivity type, preferably comprising a group I-III-VI semiconductor, or other large band gap chalcopyrite alloy material on a metal back contact; chemically depositing from solution a film of a transparent, insulating metal oxide on said first semiconductor film; and depositing a second, transparent, semiconductor film of conductivity type opposite said first type on said first semiconductor film.

More specifically, the film of transparent, insulating metal oxide is zinc oxide deposited by the steps of mixing one of zinc sulphate, zinc chloride, and zinc acetate, preferably zinc acetate, with a suitable complexing agent such as ammonium hydroxide and, preferably triethanolamine (TEA) to dissolve the zinc salt and form a zinc/ammonium ($Zn/NH_4$) complex in solution; contacting, preferably by dipping, the first semiconductor film with the solution to deposit a thin film of zinc hydroxide from the solution on the first semiconductor film, and annealing the deposited zinc hydroxide film in air for a few minutes to dry and convert the insulating zinc oxide to zinc hydroxide. The zinc hydroxide deposit may be dried in a stream of nitrogen prior to the annealing step.

Preferred solution concentrations are 0.01M $ZnAc_2$/ 0.01M TEA/ 0.64M $NH_4OH$; a dip time/temperature of 55° C./5 minutes; and air annealing at 230° C. for 10 minutes. A reduction of the concentrations of ZnAcc$_2$ and TEA of up to 50% may still result in sufficient throughput speed with acceptable yields for practical manufacture, while an increase to 0.1M ZnAc$_2$/0.1M TEA/1.5M NH$_4$OH should provide somewhat higher yields through decreased reaction times. Further increases of ammonium hydroxide concentration to 3M are feasible while increase in concentrations of ZnAc$_2$ and TEA to 1M may be possible but the lower concentrations are desirable to avoid using more chemicals than necessary.

Immersion times of between 1 and 5 minutes are effective in forming good cells on test substrates of CIS cells. Bath temperatures of 55° C. and about 20C both work well. For highest Voc, a 1 min/55° C. dip with solution concentrations of 0.01M ZnAc$_2$/0.01M TEA/0.7M NH$_4$OH is preferred while the highest efficiency was produced under the same operating conditions with a sulfidized CIS.

Furthermore, 0.01M ZnAc$_2$/0.01M TEA/.7M NH$_4$OH is preferred to 0.01M ZnSO$_4$/0.7M NH$_4$OH.

Thus, the solution may comprise 0.001M to 0.1M zinc salt dissolved in 0.001M to 1.5M ammonium hydroxide, and, more particularly, 0.01M to 0.1M zinc salt dissolved in 0.1M to 1.5M ammonium hydroxide, and, preferably, the solution comprises 0.01M to 0.1M zinc acetate, 0.01M to 0.1M TEA, and 0.6M to 1.5M ammonium hydroxide.

Semiconductor materials of the first film layer may include CIS, and other related I-III-VI tertiary compounds and other multinary compounds such as cadmium telluride (CdTe). Insulating oxide layers may include SnO$_2$, CdSnO$_4$, ZnSnO$_4$, and In$_2$O$_3$.

The schematics of the solar cell structure are similar to that described in the above-mentioned patents and U.S. No. 4,915,745 issued to Pollock on Apr. 10, 1990 (rexamined and issued on Apr. 7, 1992), the disclosure of which is incorporated herein by reference.

Figure 1:
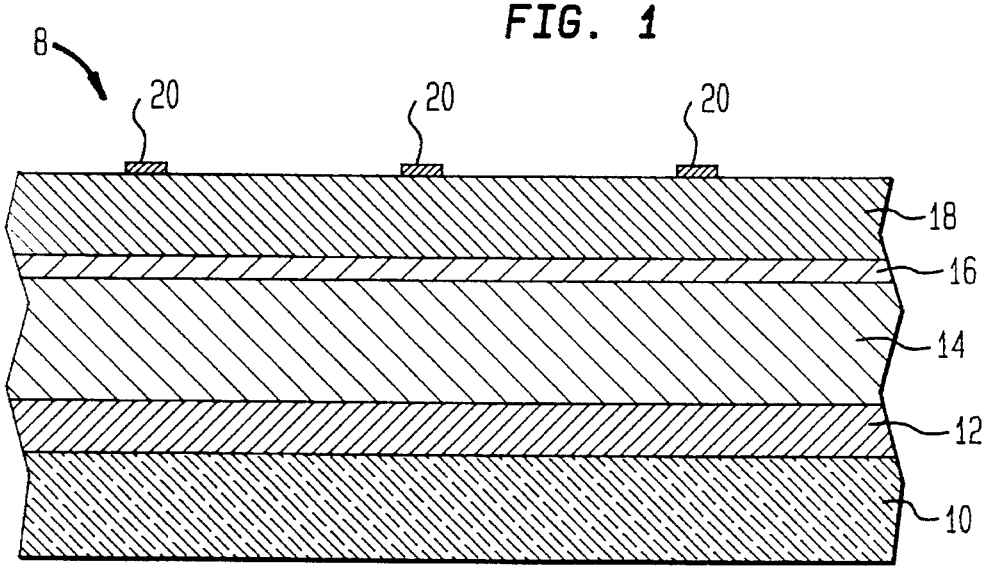
FIG. 1 is a schematic cross sectional view of a type of solar cell according to the invention; and, FIG. 2 is a Light IV curve for a cell of the invention.

As shown schematically in FIG. 1 of the drawings, the solar cell 8 is structurally supported on a glass substrate 10 having a thickness of approximately 1–4 mm. A back contact comprises a metal layer 12 of molybdenum having a thickness of approximately 0.2 microns deposited on substrate 10. The first semiconductor film 14 is p-type CIS having a thickness of approximately 1–3 microns having a thin layer 16 of insulating zinc oxide chemically deposited thereon from solution, as described below. The top layer 18 is substantially conductive, transparent, n-type CVD zinc oxide having a thickness of 0.1–3.0 microns. Front face contacts or patterning 20 are optionally deposited on the exposed surface of layer 18. The techniques used in depositing such layers other than layer 16, together with a possible additional interfacial layer such as one of gallium (Ga) between the contact and the CIS, and the preferred methods of selenization of the CIS are described in the patents referred to above.

In initial developments on a test tube scale, zinc sulfate (ZnSO$_4$) solution was mixed with ammonium hydroxide (NH$_4$OH) and a precipitate of zinc hydroxide Zn(OH)$_2$ formed. Further addition of ammonium hydroxide resulted in dissolution of the zinc hydroxide as a Zn/NH$_4$ complex formed. Dipping of small pieces of CIS substrates in the test tube batches of Zn/NH$_4$ complex formed a layer of zinc hydroxide on their surfaces which, after optional drying with a stream of nitrogen, was then converted to zinc oxide through a dehydration step, by annealing the substrates in air at a temperature of approximately 230° C. for about 10 minutes.

Using Auger electron spectroscopy (AES) analysis, it was determined that ZnO was deposited on the substrates.

Substituting AgNO$_3$ for ZnSO$_4$ and dipping Cr/glass substrates produced a visually similar white precipitate after removal. Dissolving magnesium chips in HNO$_3$ (and some HCl) and adding H$_2$O and NH$_4$OH also produced a precipitate on CIS dipped for 2 minutes and subsequently annealed at approximately 250° C.

Experiments were also performed using zinc acetate (ZnAc$_2$) and triethanolamine(TEA) as an additional complexing agent led us to believe that initially a solution of 0.01M ZnSO$_4$/0.7M NH$_4$OH and 55° C./5min dip time, then 0.01M ZnAc$_2$/0.01M TEA/0.7M NH$_4$OH showed suitable promise as chemical solutions for larger scale (Benchtop Dip) experiments.

Attempts to measure the thin, insulating interfacial films deposited by the process of the invention using electron microscopy (SEM), in which the minimum measurable thickness must be greater than approximately 10 Angstroms, revealed no discernable thickness, leading to the conclusion that the film thickness cannot be greater than 10 Angstroms.

A subsequent series of benchtop scale experiments using 10×10cm CIS test substrates were performed.

A first experiment comparing test substrates dipped in solution concentrations of 0.01M ZnSO$_4$/0.7M NH$_4$OH at 55° C. for 10 minutes, both with substrates also predipped for 30 min in ammonium hydroxide and with a cadmium sulfide control made by the conventional process described in the above patents, indicated that using zinc sulfate as the zinc salt for forming the zinc oxide film could form a reasonably good junction on CIS in place of the cadmium sulfide dip control, the zinc oxide layer cells being almost as good as the cadmium sulfide controls. However, predipping the substrates in 0.35M ammonium hydroxide for 30 minutes was found to affect, negatively, the Voc (open circuit voltage) and FF (fill factor) of the cells, resulting in lower efficiencies for that group than either the non-predipped or cadmium sulfide control groups.

A second experiment comparing substrates dipped in solution concentrations of 0.01M ZnAc$_2$/0.01M TEA/0.7M NH$_4$OH for 1 min at 55C with both dipping in only ammonium hydroxide solution and with a cadmium sulfide control demonstrated that cells made with ZnAc$_2$/TEA/NH$_4$OH performed better that the cadmium sulfide controls with higher Voc being the main improvement for the zinc oxide group. The best cell efficiency of any zinc oxide layer CIS cell produced in this experiment was 12.9% efficiency, 467 mV.

A third experiment comparing substrates dipped in solution concentrations of 0.01M ZnAc$_2$/0.01M TEA/0.7M NH$_4$OH for 1 min at 55° C. both with substrates dipped for 5 min at 55C and with cadmium sulfide control produced cells with higher Voc than in the second experiment. The 1 min/55° C. zinc oxide layer group had a best cell Voc of 495 mV.

A further experiment demonstrated that a 5 min dip at the last mentioned concentration using sulfidized CIS cells indicated that zinc oxide layer cells had higher efficiency and $V_{oc}$ than cadmium sulfide controls.

As a result of a further experiment comparing the effect of dipping for 5 minutes with the solution at room temperature with a typical 55° C. dip (only the temperature was varied), the test substrate dipped at room temperature had a best cell Voc of 468 mV compared to 424 mV for the best cell dipped at 55° C.

However, this was not confirmed by a subsequent experiment which indicated that the zinc oxide 55° C. cell group was slightly better than the room temperature group and about comparable to a larger size cadmium sulfide control. Possibly the results were affected by repeatedly using an old solution.

A further experiment comparing the performance of TEA/$NH_4OH$ only solution with that of the ZnO dip baseline conditions (0.01M $ZNAc_2$/0.01M TEA/0.64M $NH_4OH$) demonstrated that cells made without $ZNAc_2$ performed poorly, indicating that the formation of the ZnO layer is necessary for good performance.

We have also investigated the effect of the time and temperature of the dip process in two experiments. The first experiment, over the temperature range of 25°–55° C., with dip times between 1 and 10 minutes, indicated performance is improved by reducing the dip temperature. The performance peaked around 45° C. and 5 minutes but the trend in time and temperature was not very strong. The performance was, in general, better than CdS controls.

However, the results of the second experiment in which the dip temperature was the main variable, were not confirmatory, being, in general, lower and more scattered.

We believe from these experiments that the temperature of the dip/solution can be reduced below the baseline 53° C., but that the performance is not a strong function of the dip time or bath temperature.

The effect of concentration of each of the chemicals, $ZnAc_2$., TEA and $NH_4OH$, in the ZnO dip bath was first explored by preparing small quantities in test tubes to observe the solution stability. The concentrations explored were the following:

$ZnAc_2$ and TEA - 0.001, 0.01 and 0.1M $NH_4OH$ - 1.4, 0.64 and 0.35M

It appeared that the formation kinetics for the $Zn/NH_3$ and Zn/TEA complexes are rather slow in reaching equilibrium as the solubility product for $Zn(OH)_2$ is approached.

A further experiment compared the performance of cells dipped in solutions whose concentrations were selected from among those evaluated at a test tube scale. The results trend toward higher performance with increased concentration of all three chemicals. Cells dipped in 0.01M $ZnAc_2$/0.01M TEA/0.64M $NH_4OH$, and $ZnAc_2$ and TEA at 1M and $NH_4OH$ at 1.4M produced higher efficiencies than CdS controls. This may be a practical limit on concentration of these three chemicals that can be used without forming free $Zn(OH)_2$ precipitate in the bath.

The parameters necessary to convert the $Zn(OH)_2$ layer deposited in the dip bath into zinc oxide were first studied using thermal analysis. Differential scanning calorimetry of $Zn(OH)_2$ indicated that there were two transitions in the temperature range of 23°–2400° C. One at 100° C. due to evaporation of $H_2O$ and the other at around 140° C. due to the decomposition of the hydroxide to oxide.

Experiments to determine the results of annealing over the temperature range of 100°–230° C. for 5–15 minutes indicated that performance may peak around 180° C. The results varied as a function of time. At 100° C., performance trended downward with time but from 140° C. up, the trend was toward better performance with increased time.

Experiments using patterned substrates for enabling the effect of interconnects on performance to be evaluated by comparing the performance of baseline operating conditions with that of CdS controls using the minimodule test structure scheme designed by K. Knapp (Oct. 25, 1990, Procedures for Fabricating Post-Module Test Structures), revealed no significant difference between the performance of ZnO dip and CdS control parts.

Although the CIS has been contacted with the solution by dipping in a bath thereof it is envisaged that, in an alternative approach, the solution may be sprayed on the CIS.

Figure 2:
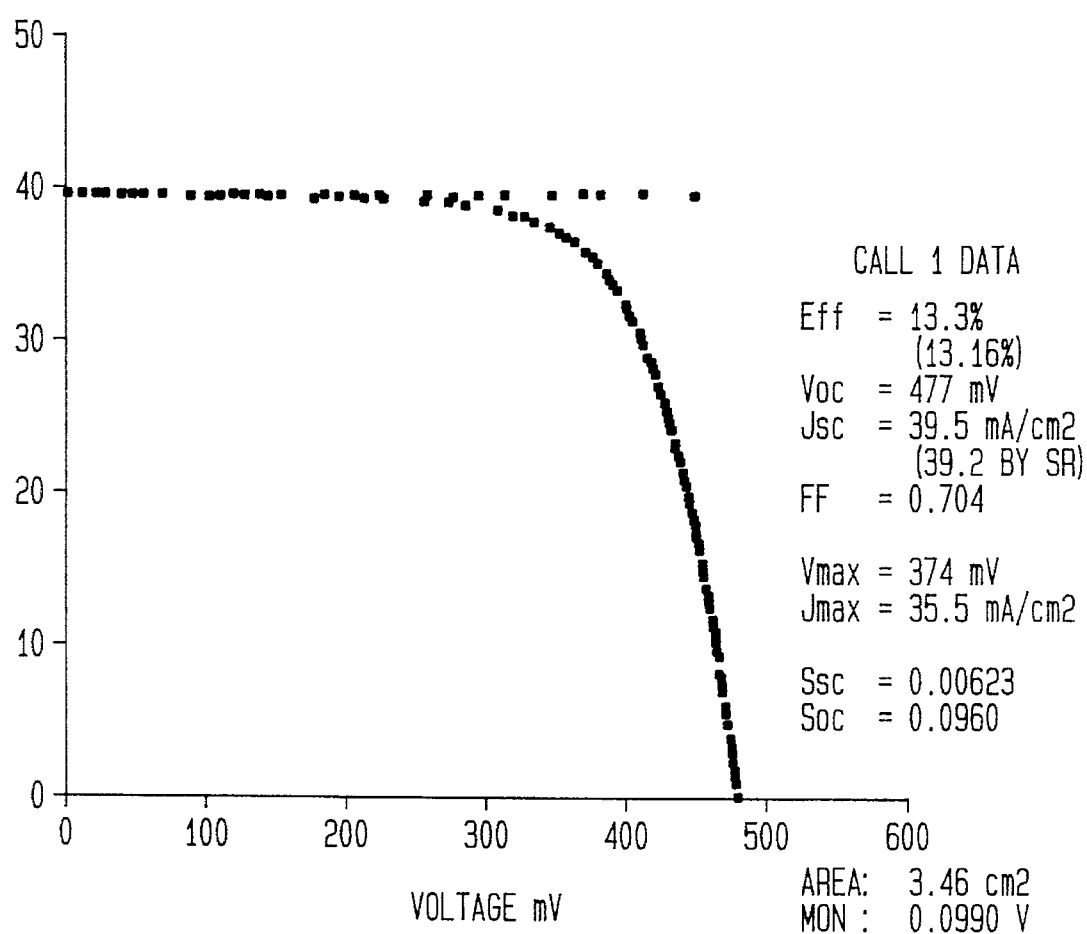

FIG. 2 shows the Light IV curve for a 13.1% efficient cell formed from a dip concentration of 0.01M $ZNAc_2$/0.01M TEA/0.7M $NH_4OH$.

It will be apparent from the foregoing that highly efficient and, in some respects better performing, cells are produced by substituting a chemically deposited, zinc oxide layer, for the prior cadmium sulfide layer thereby affording the opportunity of obviating the risks associated with using highly toxic materials such as cadmium.

We claim:

1. A process for making a thin film heterojunction photovoltaic device comprising the steps of:

depositing a first film of p-type copper indium diselenide film on a metal back contact;

chemically depositing from solution a thin film of zinc hydroxide on said first film;

converting said zinc hydroxide to a transparent, insulating zinc oxide thin film; and depositing a second film of n-type transparent zinc oxide on said transparent, insulating zinc oxide thin film.

2. A process according to claim 1 in which the film of transparent, insulating zinc oxide is deposited by the steps of:

mixing a zinc salt with a suitable complexing agent to dissolve the zinc salt and form a zinc/ammonium (Zn/$NH_4$) complex in solution;

contacting the first film with the solution to deposit said thin film of zinc hydroxide from the solution thereon;

annealing the deposited zinc hydroxide film to convert the zinc hydroxide to said transparent, insulating zinc oxide thin film.

3. A process according to claim 2 in which the zinc salt is one of zinc sulphate, zinc chloride, and zinc acetate.

4. A process according to claim 2 wherein the complexing agent comprises ammonium hydroxide.

5. A process according to claim 4 wherein the zinc salt is zinc acetate and the complexing agent further comprises triethanolamine.

6. A process according to claim 5 wherein the solution comprises 0.001M to 0.1M zinc salt dissolved in 0.001M to 1.5M ammonium hydroxide.

7. A process according to claim 6 wherein the solution comprises 0.01M to 0.1M zinc salt dissolved in 0.1M to 1.5M ammonium hydroxide.

8. A process according to claim 7 wherein the solution comprises approximately 0.01M zinc salt dissolved in approximately 0.7M ammonium hydroxide.

9. A process according to claim 5 wherein the solution comprises 0.01M to 0.1M zinc acetate, 0.01M to 0.1M TEA and 0.6M to 1.5M ammonium hydroxide.

10. A process according to claim 9 wherein the solution comprises approximately 0.01M zinc acetate, 0.01M TEA and 0.64M ammonium hydroxide.

11. A process according to claim 9 wherein the thickness of the film of insulating zinc oxide is no greater than 10 angstroms.

12. A process according to claim 9 wherein the first film is contacted with the solution for a period of between 1 and 10 minutes.

13. A process according to claim 4 wherein the zinc salt is zinc sulfate.

* * * * *